US009660660B1

(12) United States Patent
Beukema et al.

(10) Patent No.: US 9,660,660 B1
(45) Date of Patent: May 23, 2017

(54) ANALOG TO DIGITAL CONVERTER WITH HIGH PRECISION OFFSET CALIBRATED INTEGRATING COMPARATORS

(71) Applicant: INTERNATIONAL BUSINESS MACHINES CORPORATION, Armonk, NY (US)

(72) Inventors: Troy Beukema, Briarcliff Manor, NY (US); Yong Liu, Rye, NY (US); Sergey Rylov, White Plains, NY (US); Mihai A. Sanduleanu, United Arab Emirates (AE); Zeynep Toprak Deniz, Norwalk, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/273,397

(22) Filed: Sep. 22, 2016

Related U.S. Application Data

(63) Continuation of application No. 14/941,245, filed on Nov. 13, 2015.

(51) Int. Cl.
| | |
|---|---|
| *H03M 1/06* | (2006.01) |
| *H03M 1/10* | (2006.01) |
| *H03M 1/12* | (2006.01) |
| *H03M 7/16* | (2006.01) |
| *H03M 1/36* | (2006.01) |

(52) U.S. Cl.
CPC ......... *H03M 1/1023* (2013.01); *H03M 1/124* (2013.01); *H03M 1/361* (2013.01); *H03M 7/165* (2013.01)

(58) Field of Classification Search
CPC ............................ H03M 1/363; H03M 1/1023
USPC ................. 341/144, 155, 120, 172, 118, 143
See application file for complete search history.

(56) References Cited

U.S. PATENT DOCUMENTS

| | | | |
|---|---|---|---|
| 7,492,301 B1 | 2/2009 | Hagleitner et al. | |
| 7,994,960 B1 | 8/2011 | Li | |
| 8,749,425 B1 | 6/2014 | Hu et al. | |
| 2005/0285763 A1 | 12/2005 | Nguyen et al. | |
| 2006/0055577 A1* | 3/2006 | Boemler | H03M 1/46 341/155 |
| 2008/0180289 A1 | 7/2008 | Su et al. | |
| 2011/0215956 A1 | 9/2011 | Ishikawa | |
| 2011/0298641 A1 | 12/2011 | Khanpour et al. | |

(Continued)

OTHER PUBLICATIONS

U.S. Appl. No. 14/941,245, filed Nov. 13, 2015.

*Primary Examiner* — Peguy Jean Pierre
(74) *Attorney, Agent, or Firm* — F. Chau & Associates, LLC

(57) ABSTRACT

An analog-to-digital converter includes a plurality of slave sampler multiplexers responsive to outputs of a master sampler that receives analog signals and whose output ports connect to integrating threshold comparators having capacitive digital-to-analog conversion offset adjustments for forming an analog-to-thermometer code conversion. A calibration state machine receives outputs of each of the integrating threshold comparators to control the capacitive digital-to-analog conversion offset adjustment of every integrating threshold comparator and to control a calibration digital-to analog converter. A thermometer code to binary code logic decoder receives outputs of each of the integrating threshold comparators and outputs digital samples.

6 Claims, 6 Drawing Sheets

(56) References Cited

U.S. PATENT DOCUMENTS

2012/0206283 A1* 8/2012 von Staudt ......... H03M 1/1061
341/121
2013/0156126 A1 6/2013 Chung et al.
2015/0347341 A1 12/2015 Johnson

* cited by examiner

ANALOG TO DIGITAL CONVERTER WITH HIGH PRECISION OFFSET CALIBRATED INTEGRATING COMPARATORS

CROSS-REFERENCE TO RELATED APPLICATION

This application is a Continuation Application of co-pending U.S. patent application Ser. No. 14/941,245, filed on Nov. 13, 2015, the entire contents of which are incorporated by reference herein.

TECHNICAL FIELD

The present disclosure relates to electronic devices and, more particularly, to a high data rate (25 Gs/s range) flash analog-to-digital (ADC) converter for use in serial line receivers employing an architecture that combines power and area efficient integrating comparators with an automatic offset calibration system.

DISCUSSION OF RELATED ART

ADCs play a critical role in today's electronic circuits, computing systems, and communication systems. For example, modern coding schemes in data communication require the use of an ADC at the receiver side. Modern integrated circuit complementary metal-oxide-semiconductor (CMOS) technology has improved to the point that system designs which have historically been realized using analog techniques can now be built with a combination of ADC and digital signal processing techniques.

BRIEF SUMMARY

Exemplary embodiments of the present disclosure provide a FLASH ADC architecture using a coarse resistive ladder (RLADDER) to establish baseline comparator threshold, combined with a current integrating comparator with a programmable capacitance digital-to-analog converter (CDAC) arranged in a manner to provide a segmented, overlapped offset voltage characteristic to ensure coverage of all offsets over a prescribed range.

Exemplary embodiments of the present disclosure also provide a multiplexing structure which enables ADC threshold comparators to be dynamically offset calibrated, ensuring high ADC performance across voltage and temperature drift.

In accordance with an exemplary embodiment of the present disclosure an analog-to-digital converter includes a plurality of integrating threshold comparators for forming analog-to-thermometer code conversions and a thermometer code to binary code logic decoder configured to receive and combine outputs of each of the integrating threshold comparators and output digital samples. Capacitive digital-to-analog conversion offset adjustment of the integrating threshold comparators is controlled by a calibration state machine.

The analog-to-digital converter may include a master sampler and a plurality of integrating threshold comparators for forming analog-to-thermometer code conversions. A plurality of slave sampler multiplexers may be responsive to the outputs of the master sampler and whose output ports connect to respective ones of the plurality of integrating threshold comparators. The calibration state machine may be configured to receive outputs of each of the integrating threshold comparators and to control a calibration digital-to-analog converter. A thermometer code to binary code logic decoder may be configured to receive outputs of each of the integrating threshold comparators and output digital samples. The slave sampler multiplexers and the thermometer code to binary code logic decoder may each be configured to support replacement of an arbitrary threshold comparator with a replacement threshold comparator to enable automatic calibration of data comparators without intermittently upsetting the analog-to-thermometer conversions. The calibration state machine may output controls to the calibration digital-to-analog converter for controlling capacitive digital-to-analog conversion offset adjustments of the integrating threshold comparators.

A coarse resistive ladder may be configured to establish a baseline comparator threshold for each of the integrating threshold comparators.

The master sampler may include a master sample buffer configured to receive a differential input signal and to drive a series sampling switch that tracks the input signal in a track state and freezes the output signal in a hold state, and a slave sample buffer configured to receive a tracked/held signal from the master sample buffer and to drive the plurality of slave sampler multiplexers.

The slave sampler multiplexers may each include three inputs: a Data (D) input, a Calibration (C) input, and a strap (S) input, each of the three inputs being connected to a single output port via a series of switches, and the single output port of the slave sampler multiplexers may respectively drive a single input of each of the plurality of integrating threshold comparators.

When in normal operating mode, data port (D) input may be connected to the slave sample buffer during a slave hold mode and may be disconnected during a slave track mode, and strap port "S" may be connected to the other active integrating threshold comparators to maintain a common voltage at the data port (D) across the integrating threshold comparators while the slave sampler multiplexers are in hold mode.

When in slave hold mode, the integrating threshold comparators may determine a difference signal between a coarse reference voltage provided by the coarse resistance ladder and a signal at its input port, the difference signal driving latches that determine if the data signal is above or below a reference threshold.

Each integrating threshold comparator may include a differential comparator that inputs differential data input from a respective slave sampler multiplexer and differential reference inputs from coarse resistive ladder, and adjustable capacitance-digital-to-analog-converters in parallel with outputs of respective integrating threshold comparators and configured to compensate for undesired voltage offsets in response to control signals from the calibration state machine.

The calibration digital-to-analog converter may be driven by the logic state machine to determine appropriate values to store to the capacitance-digital-to-analog converters to cancel integrating threshold comparator offsets.

In accordance with an exemplary embodiment a data receiver includes an input amplifier configured to receive and amplify an analog signal and an analog-to-digital converter configured to receive an amplified analog signal output from the input amplifier and to convert the amplified analog signal to a digital signal, the analog-to-digital converters being configured as described above.

BRIEF DESCRIPTION OF THE DRAWINGS

Exemplary embodiments will be more clearly understood from the following detailed description taken in conjunction with the accompanying drawings in which.

DETAILED DESCRIPTION

Figure 1:
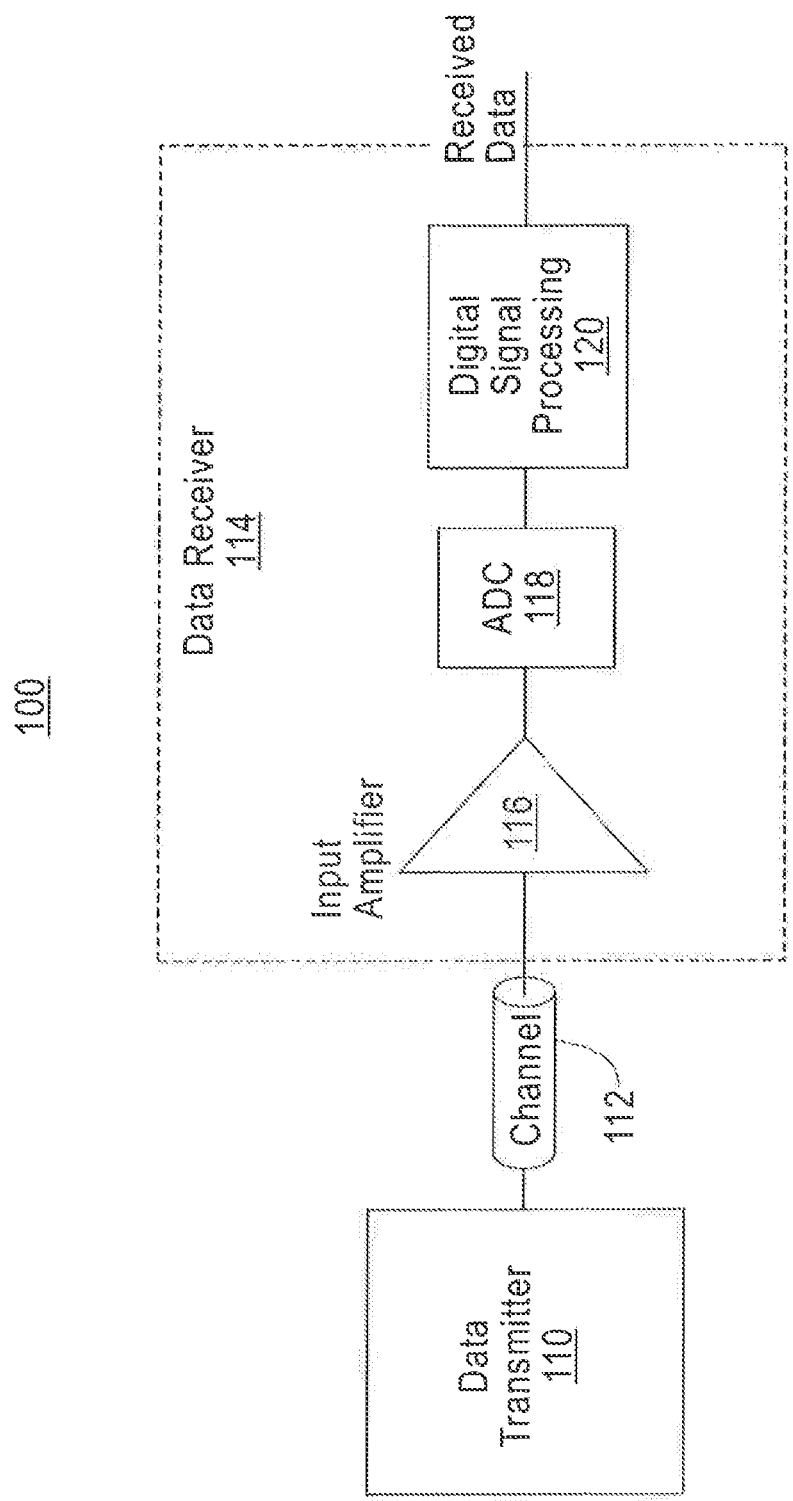
FIG. 1 depicts a data transmission system in accordance with an exemplary embodiment of the present disclosure.

Reference will now be made in more detail to the exemplary embodiments which are illustrated in the accompanying drawings, wherein like reference numerals refer to the like elements throughout.

Referring to FIG. 1, data transmission system 100 includes data transmitter 110, channel 112 and digital data receiver 114. In this type of a system, a received analog signal is first amplified by input amplifier 116 converted to a digital format by ADC 118 and then processed by digital signal processor 120 to produce received data sent by transmitter 110. The digital-based approach fully leverages the power/area reduction offered by corresponding shrinking power/area requirements of digital devices, such as metal-oxide-semiconductor field-effect transistors (MOSFETs) in advanced CMOS technology. It also greatly increases the flexibility of the type of signal processing that can be done on a received signal so that complex and bandwidth efficient data encoding techniques can be used, such as multilevel modulation or orthogonal-frequency-division-multiplexing (OFDM). These techniques will become essential to future digital communication systems to support continued increase of payload data rates through channels with limited bandwidth such as the electrical backplane channels used in networking routers/switches and scalable multi-processing computer systems.

To enable practical use of digital receiver system design, the ADC must be designed in a way to simultaneously achieve high performance, low silicon die area, and low power consumption. The power and area constraints are critical in applications such as high density switch/router application specific integrated circuits (ASICs) which typically may employ 100 or more high speed input/outputs (I/Os) per die. A need exists for an ADC architecture that can support 25 Gb/s+ line signaling used in modern high I/O density networking and data processing systems.

For example, one type of ADC is a FLASH ADC which is a type of ADC that uses a linear voltage ladder with a comparator at each "rung" of the ladder to compare an input voltage to successive reference voltages. The output of these comparators is generally fed into a digital decoder, which converts the inputs into a binary value.

Conventional FLASH ADC solutions typically require large die areas, resulting in higher cost and power, and are not capable of achieving very high threshold accuracy, such as 1 mV differential non-linearity (DNL). Similarly, a need exists to provide low power, low area FLASH ADCs capable of achieving such very high threshold accuracy.

Figure 2:
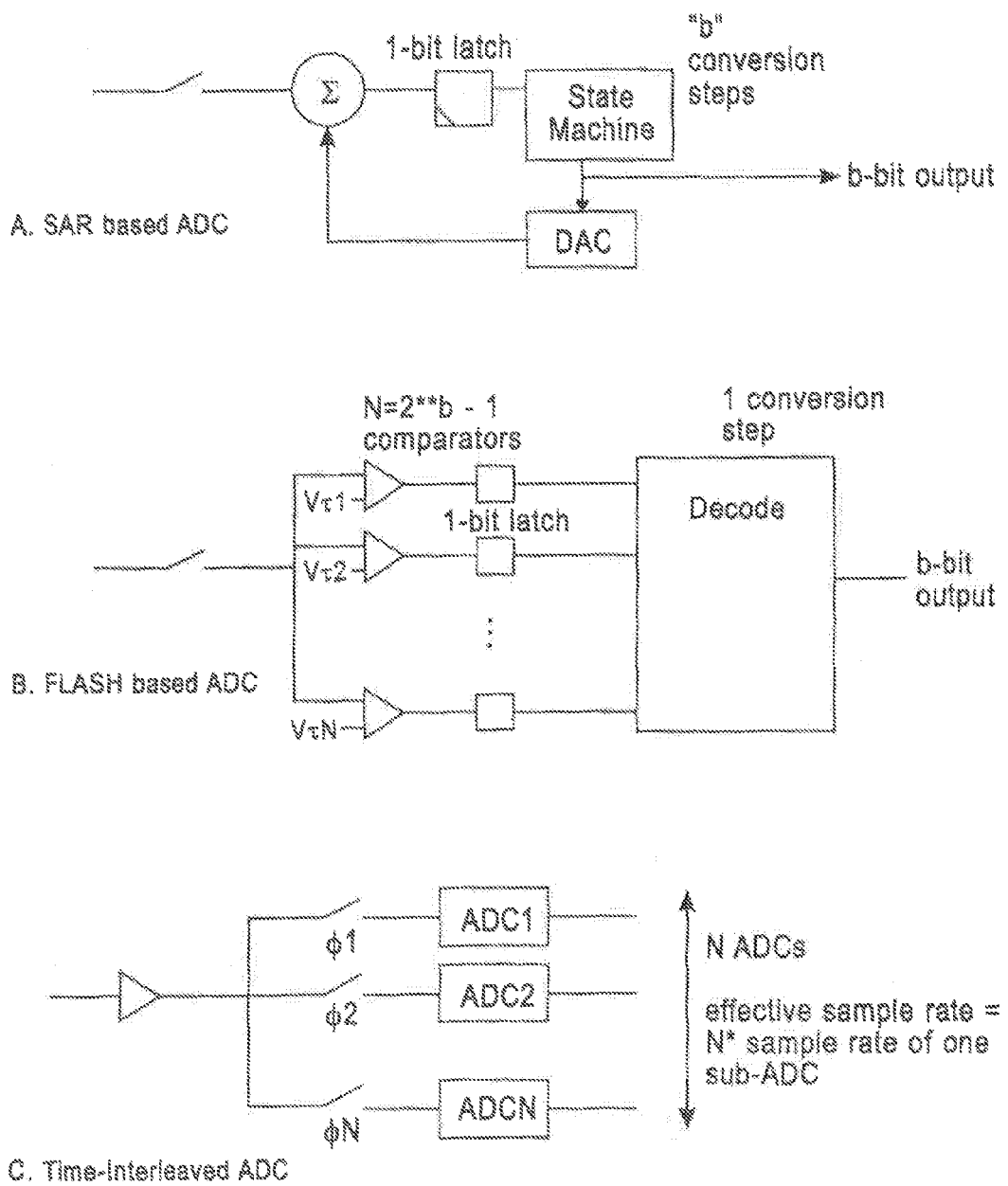
FIG. 2 depicts alternative analog-to-digital converters in accordance with exemplary embodiments of the present disclosure.

In more detail, two common solutions to realize an ADC for very high speed data receiver applications include both FLASH and successive-approximation register (SAR) based approaches. High level block diagrams of these designs are shown in FIG. 2. The SAR based ADC, depicted in part A of FIG. 2, uses a single-bit comparator to effectively binary-search a sampled signal in "b" steps where "b" is the number of bits in the digital output sample. Due to the need for "b" steps in the conversion process, the SAR based ADC sample rate is normally limited to the range of ~1 Gs/s (i.e., for a typical 5-7 bit conversion the SAR can go through all 5-7 search steps in 1 ns). Although the SAR can provide very good power efficiency, its design realization is complicated by the need to implement a large number (32 or more) of low-frequency SAR based ADCs in parallel to achieve a high aggregate conversion data rate, as an example if a 1 Gs/s SAR converter is used, 32 must be time interleaved to achieve 32 Gb/s conversion rate, as depicted in part C of FIG. 2. This large number of ADCs complicates the implementation, by requiring each ADC to be gain matched to avoid degrading the ADC effective-number-of-bits (ENOB) performance and in turn receiver bit-error rate (BER) performance. Also, the SAR architecture has a potential exposure to "metastability" at any point in its b-bit conversion step, i.e., if the SAR comparator input is exactly at the threshold between producing 0 and 1 output, the output bit can't be regenerated quickly to drive the feedback digital to analog converter (DAC) for the next SAR conversion step and the binary search state machine can either hang up or produce a bad input to the feedback DAC and result in a bad conversion sample. This issue can result in an operating BER floor for the data receiver, which is undesired in data and networking communication systems which typically require BER in the range of 1E-12 to 1E-15 or lower.

Still referring to FIG. 2, to both eliminate the SAR metastability problem and enable a much higher fundamental conversion rate so less ADC interleaving is needed to achieve high aggregate sample rates, the FLASH based ADC, depicted in part B of FIG. 2, can be considered. This ADC converts an analog voltage to a digital code in one compare cycle by using ~2**b-1 comparators, where b is the number of digital code bits (5, 6, etc.). Because of this fast conversion time, it is practical to build FLASH based ADCs which convert at very high sample rates. As an example, an 8 Gs/s ADC can easily be designed in modern 32 nm CMOS technology, requiring only 4 (~10× less than a SAR) to be interleaved to achieve an aggregate 32 Gs/s conversion rate. The FLASH based ADC avoids the sample metastability problem since subsequent logic and latching in the decode section can "clean up" any metastable samples which occur at each comparator threshold so the digital output word is valid even if one of the FLASH threshold comparators is metastable.

The FLASH-based ADC has a main disadvantage of requiring a large number of comparators, which limits it to applications of moderate to low precision in area and power constrained applications. For high data rate wireline receivers, 5 to 6 bit precision provides good performance in non-return to zero (NRZ) line-signaling systems, which is low enough precision to consider use of the FLASH architecture. The large number of parallel comparators in the FLASH still present a difficult problem for a practical implementation, however, since to maintain good performance each of the threshold comparators must be precisely compensated for voltage offsets occurring due to process, voltage, and temperature (PVT) variations. Also, to maintain a low area implementation, each of the threshold comparators must be as compact as possible. The present disclosure describes a novel ADC architecture which combines a high-precision, power and area efficient comparator design with an automatic offset calibration system to enable the use of the FLASH ADC architecture in high I/O density, high speed wireline applications.

Figure 3:
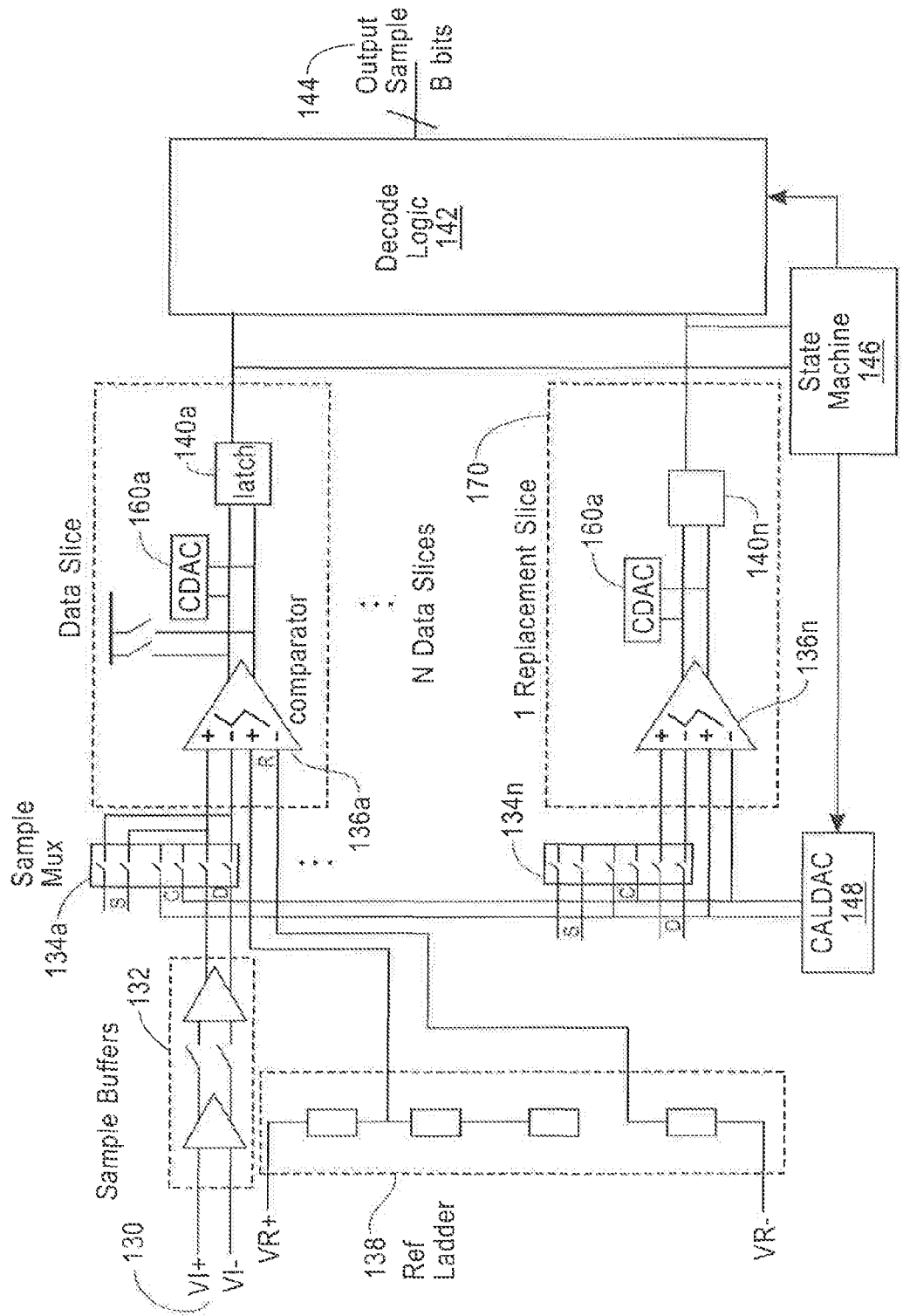
FIG. 3 depicts a FLASH analog-to digital converter in accordance with an exemplary embodiment of the present disclosure.

Referring now to FIG. 3, a FLASH ADC employing high precision, power and area efficient threshold comparators with an automatic threshold calibration system is depicted.

Differential input signal VI+/VI− 130 is applied to master-slave sampler 132. Master-slave sampler 132 includes a first (master) sample buffer which is typically realized as a source follower using methods known in the art. The first sample buffer drives a series sampling switch which tracks the signal in "track" state and freezes the output signal in "hold" state. The second (slave) sample buffer (also typically realized as a source follower) receives the tracked/held signal from the master sampler and drives novel passgate-mux structures 134a, . . . 134n which act as either the slave sampler or routes a calibration voltage level to connected threshold comparators 136a, . . . 136n. Specifically, passgate-mux structures 134a, . . . 134n each include three inputs: a Data (D) input, a Calibration (C) input, and a strap (S) input. Each of these three inputs is connected to a single output port via series switches built using CMOS passgates in an exemplary embodiment. The single output port of passgate-mux structures 134a, . . . 134 drive a single input of threshold comparators 136a, . . . 136n. In normal operating mode when a threshold comparator is being used as part of the FLASH conversion process, data port (D) input is connected to the slave sample buffer during master "hold" mode (this is slave "track" mode) and is disconnected during master "track" mode (this is slave "hold" mode). Strap port "S" is connected to all of the other active (i.e., comparators being used as part of the FLASH ADC conversion process) threshold comparator passgate-mux ports. The function of floating strap port "S" is to maintain a common voltage at the output port D across all N threshold comparators while the threshold comparator passgate-muxes are in "hold" mode. During passgate-mux "hold" mode, a differential integrating comparator 136a, . . . 136n determines a difference signal between a coarse reference voltage provided by reference ladder 138 and the signal at its input port. This difference signal drives latches 140, . . . 140n which determine if the data signal is above or below the reference threshold. The outputs of all threshold comparators are sent to a logic block 142 which performs decoding of the digital signals to output digital sample value 144. The digital threshold comparator outputs are also sent to a state machine 146 to drive an automatic threshold calibration system (CALDAC) 148. In an exemplary embodiment, the reference thresholds for all threshold comparators are uniformly spaced from approximately −250 mV to +250 mV in steps determined by the least LSB size of the ADC, which is approximately 16 mV for a 5b ADC realization and 8 mV for a 6b ADC realization.

Figure 4:
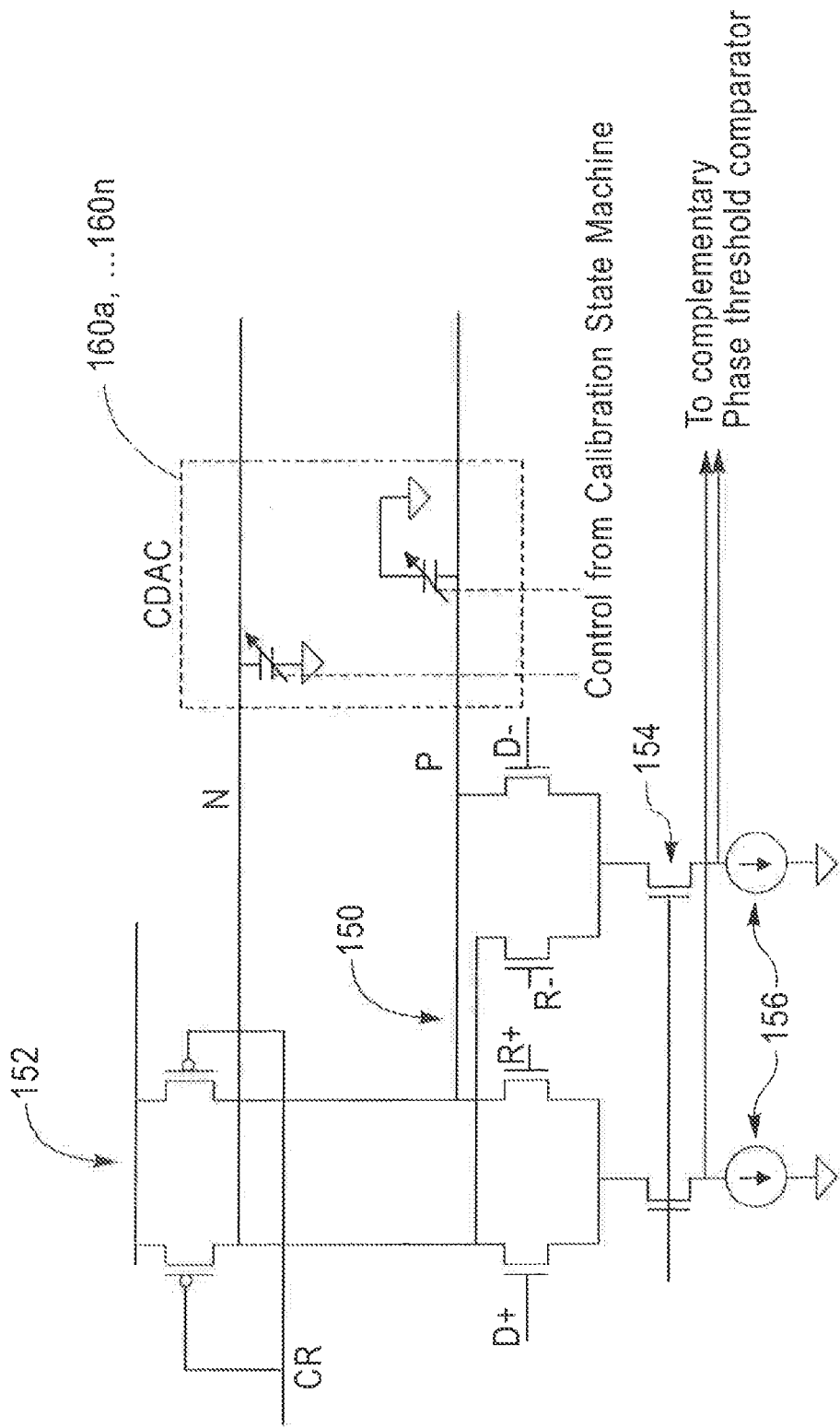
FIG. 4 depicts a representative integrating threshold comparator in accordance with an exemplary embodiment of the present disclosure.

A detailed diagram of integrating threshold comparators 136a, . . . 136n is shown in FIG. 4. Each comparator uses a differential comparator 150 which inputs differential data inputs (D+, D−) from the output of a respective sample-mux 134a, . . . 134n and differential reference inputs (R+,R−) from resistive reference ladder 138. Reset switches 152 hold the output voltage of the comparator at differential 0 for the first ½ of the sample clock cycle, while the slave sampler is in "track" mode. Clock signal CR goes high to turn off the integrator reset switches and enable the threshold comparator to begin integrating for the second half of the sample clock cycle, at this same time the slave sampler is in "hold" mode so the voltage at the input of the threshold comparator is no longer changing from the data input. At the end of the integration period (nominally ½ the time of the ADC sample period), the P leg of the comparator will be higher voltage than the N leg of the comparator if the data signal D is greater than the reference signal R, indicating the input signal is larger than the reference value. Sample latches 140a, . . . 140n as seen in FIG. 3, realized as a typical differential cascade voltage switch (DCVS) latch well known in the art, connects to the outputs of the threshold comparator to determine a binary "1" value if the data signal is greater than the reference signal and a "0" otherwise. The array of all threshold comparator digital outputs therefore forms a "thermometer" conversion code, which contains all 1 s for threshold comparators with references below in the sampled data level and 0 for all threshold comparators with references above the sampled data level.

Still referring to FIG. 4, a power saving feature in an exemplary embodiment will employ current sharing in the integrating threshold comparators by adding tail current switches 154. In an exemplary embodiment, several FLASH ADCs can be interleaved, as seen in Part C of FIG. 2, to support a higher aggregate data rate than that achievable with a single ADC. As an illustrative example, a 32 Gs/s ADC can be constructed using four 8 Gs/s FLASH ADCs using interleaving techniques well understood in the art. In this structure, two 8 Gs/s ADCs are always operating on complementary sample phases, meaning that the integrating comparators of one ADC will be in reset state while the integrating comparators in the second ADC will be in integrating state. During reset state, the tail current is not needed, so only one tail current 156 can be used to supply two integrating comparators of opposite clock phases in the interleaved ADC. This saves both power and area in the physical implementation of the interleaved ADC.

Due to process imperfections, significant undesired voltage offsets can occur in sample buffers 132, threshold comparators 136a, . . . 136n and threshold data latches 140a, . . . 140n. To compensate these offsets, capacitance-digital-to-analog-converters (CDACs) 160a, . . . 160n are placed in parallel with the output of respective integrating threshold comparators 136a, . . . 136n as shown in detail in FIGS. 3 and 4. By appropriately adjusting the CDAC 160a, . . . 160n, the unwanted offsets can be compensated to high precision. In an exemplary embodiment, respective CDACs 160a, . . . 160n are implemented with a nominal 9-bit precision to cover an offset adjust range of −90 mV to +90 mV in sub-mV (approximately 0.5 mV) steps.

Figure 5:
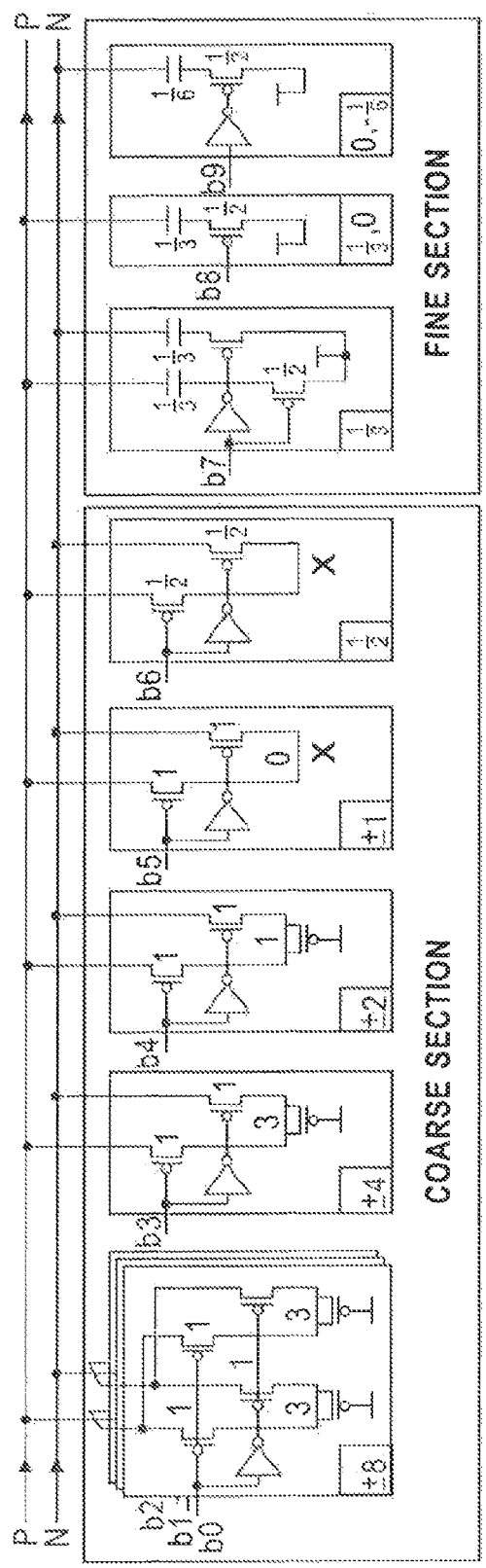
FIG. 5 depicts a capacitive digital-to-analog converter in accordance with an exemplary embodiment of the present disclosure.

Referring now to FIG. 5, an exemplary embodiment of a typical implementation of the CDAC using MOSFET devices is illustrated. Those skilled in the art would recognize that the use of a variable CDAC may be implemented by any means combined with an integrating summer in an ADC realization. The high precision adjustment of the CDAC enables the ADC thresholds (separated by one least significant bit (LSB)) to be calibrated to very high precision (nominally 1 mV accuracy), which improves the effective-number-of-bits (ENOB) achievable by the ADC and in turn improves system performance by more accurately converting a received analog signal to a digital code. The detailed schematic shown in FIG. 5 is of a practical implementation of a 9-bit CDAC. The CDAC consists of two independent sections, a coarse section with resolution of 6 bits, and a fine section with resolution of 3 bits.

The 6-bit coarse section consists of 7 independent "steering blocks", each of which is intended to connect a certain number of capacitance "units" to one of the two CDAC terminals P,N—depending on the value of its control bit (b0-b6). 3 of the 7 blocks (b0-b2) have identical weight of 8 units, whereas the remaining 4 blocks (b3-b6) use binary weights of 4, 2, 1, and ½ units. In other words, the 6-bit coarse CDAC section uses a 7-bit control signal b0-b6, of which the 3 most significant bits (MSBs) b0-b2 are thermometer-encoded, whereas the remaining 4 bits b3-b6 are binary-encoded. All steering blocks of the coarse CDAC section, except for its LSB, are made of identical single-finger PFETs serving either as plain unit capacitors or as switches (that still remain unit capacitors when on), whereas the LSB block is made of half-sized fingers.

As shown in FIG. 5, each steering block of the coarse CDAC section uses a basic circuit that consists of two switches controlled by complementary logic signals (so one switch is on and the other is off) that are connected on one side to the two CDAC terminals P, N and on the other side to a common capacitive node. That common node has either 3, 1, or 0 unit capacitance connected to it. Therefore the "on" switch of that "basic circuit" would connect to a respective CDAC terminal (P or N) both its own capacitance (of one unit) and the capacitance of the common capacitive node (of 3, 1, or 0 units) for a total connected capacitance of 4, 2, or 1 units. The MSB steering blocks b0-b2 use two instances of that basic circuit with 3-unit common node (thus yielding 8 units of connected capacitance), whereas the LSB block b6 uses half-sized switches and no capacitance on the common node, yielding ½ units of connected capacitance.

As FIG. 5 shows, the 3-bit fine section of the CDAC uses 3 binary encoded non-steering blocks that are made using half-size PFET switches connected in series with small capacitors implemented using parasitic wire capacitance. Note that the positions of the switch and the capacitor have significantly changed compared to the coarse section: the switch no longer connects to the CDAC terminal (P,N), but instead is positioned between the high supply rail (VDD) and the wire capacitor, which in turn connects to the CDAC terminal. This position swap prevents the switch own relatively large capacitance (which is different in its on and off states) from directly affecting the CDAC, and allows to use the PFET as a switch only (and not as a capacitor that would be too big for a fine section). The wire capacitor is sized according to the following criterion: its effective "size" (as marked on FIG. 5) is a difference between its own capacitance and a that capacitance when combined in series with a parasitic "feedthrough" capacitance of the switch in its "off" state (the latter is not zero). Nominally the weights of the three binary blocks b7-b9 of the fine CDAC section would simply continue the binary progression of weights started in the coarse section, i.e. they would behave as steering sections with weights of ¼, ⅛, and 1/16. However, only the MSB of the fine section is done using this "steering" approach, i.e., when it connects some unit X of capacitance to one CDAC rail, it simultaneously disconnects it from another rail, denoted in FIG. 5 for all steering blocks [b0-b7] as "+/−X", i.e. its contribution is either +X, or −X for a total change of 2X when a control bit is flipped. In contrast, sections b8 and b9 are non-steering, i.e., they use only one switch and one wire capacitor per block, connected to only one CDAC terminal (P for b8, N for b9). As a consequence, with switch in off state, there is no contribution from that section to the CDAC capacitance (denoted as "0") whereas when the switch is "on" that block would contribute either +X or −X, depending on whether it is connected to a P or an N CDAC terminal.

Thanks to using a combination of steering and non-steering topology within the fine CDAC section, it needs only two sizes for its wire capacitors, nominally ¼ and ⅛ units in respect to the unit used in the coarse CDAC section (which is one fixed-size PFET finger). However targeting such ratio precisely is impractical due to significant process variations at deep submicron fabrication nodes, since gate capacitance of PFET devices and parasitic wire capacitance vary with process independently and hence fail to track each other well. In order to mitigate such mismatch a commonly used technique is to create a small intentional overlap of the range of the fine section in respect to one LSB of the coarse section, i.e. use in the fine section capacitors slightly larger than ¼ and ⅛ units, which is illustrated in FIG. 5 with using values of ⅓ and ⅙ units respectively (i.e. 33% larger). Such range overlap reduces the overall CDAC resolution from nominal 9 bits to about 8.5 bits, which is still sufficient to maintain CDAC LSB at 0.5 mV level over a desired range of +/−90 mV.

Referring back to FIG. 3, to determine appropriate values to store to the CDAC to cancel threshold comparator offsets, CALDAC 148 is driven by logic state machine 146. The state machine inputs the threshold comparator binary outputs from all ADC thresholds and outputs controls to the CDACs of every threshold comparator slice in the ADC, and also outputs a control signal to CALDAC 148. To enable automatic calibration of the slices without intermittently upsetting the ADC conversion code, a threshold comparator replacement slice 170 is introduced. To calibrate the offset of a given ADC threshold comparator, the following steps are then followed and realized by state machine 146:

1) The state machine programs the CALDAC to create the reference voltage associated with the threshold comparator to be calibrated.

2) The replacement slice threshold comparator input is connected to CALDAC (C) input, and replacement slice floating strap (S) port and (D) ports are disconnected.

3) The replacement slice CDAC 160*n* is adjusted to remove the offset in the replacement slice. This adjustment is done by increasing or decreasing the replacement slice CDAC 160*n* value as a function of the replacement slice binary output using a first-order integration feedback loop as is well understood in the art.

4) The replacement slice CALDAC (C) port is disconnected from its threshold comparator input.

5) The replacement slice floating strap (S) port is connected to the floating strap and the (D) port is connected to its comparator input.

6) The decode logic 142 is configured to "ignore" the threshold comparator being calibrated and use in its place the output of the replacement slice to determine the ADC output code. At this time the binary outputs of the replacement slice and the threshold comparator to be calibrated are nominally identical.

7) The threshold comparator to be calibrated data (D) port is disconnected from the input, and the (S) port is disconnected from the floating strap.

8) The threshold comparator to be calibrated CALDAC (C) port is connected to its threshold comparator input.

9) The threshold comparator to be calibrated CDAC is adjusted to remove the offset in accordance with the offset adjust method described in step (3).

10) The threshold comparator to be calibrated CALDAC (C) port is disconnected from its threshold comparator input.

11) The threshold comparator to be calibrated data (D) port is connected to the input, and the (S) port is connected to the floating strap.

12) Decode logic 142 is configured to use the threshold comparator being calibrated output to determine the ADC output code, and ignore the output of the replacement slice.

13) The replacement slice (S) port and (D) ports are disconnected from the input.

The above procedure is repeated for all threshold comparators in the ADC in a cyclic fashion so that the offset compensation can track operation voltage and temperature drift, in addition to compensating systematic offsets due to process variation.

The above-described steps result in an appropriate offset programmed in the CDACs of the threshold comparators to remove the offsets inherent in the reference ladder, the threshold comparator, and the DCVS latch connected to the threshold comparator outputs. Offsets which can occur in the sample buffers 132 or other earlier circuit stages in front of the ADC can be compensated by analyzing the statistics of the ADC output codes, for instance the mean+ and − level of the ADC codes at a data sample point can be used to drive a systematic offset applied to the CALDAC reference value for each interleaved ADC in an exemplary embodiment. In an exemplary embodiment, a linearly varying offset may also be applied to the CALDAC threshold comparator reference values (for example, adjust the CALDAC reference voltage by −GAIN_OFFSET at most negative threshold going to +GAIN_OFFSET at most positive threshold with uniform steps in-between) to achieve an effective gain adjustment for each ADC. This enables all ADCs in an interleaved ADC to be gain aligned with high precision. In an exemplary embodiment, a gain alignment algorithm may also be driven by analyzing statistics of the received data, for instance by finding the difference between the mean+ and − values of a received signal at a data sample point, a value proportional to path gain can be determined. A simple algorithm (i.e. a first order integration loop as is well known in the art) can then adjust the GAIN_OFFSET value for each ADC in an interleaved ADC implementation so that the difference between the mean+ and − values is balanced across all interleaved ADCs.

Figure 6:
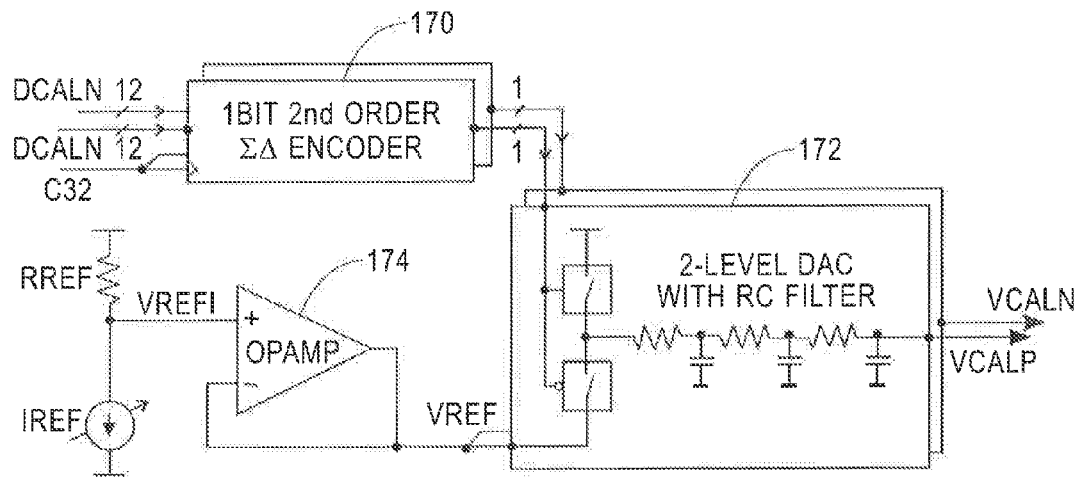
FIG. 6 depicts a differential calibration digital-to-analog converter in accordance with an exemplary embodiment of the present disclosure.

CALDAC 148 is an integral part of the described offset adjustment system since it must provide a high precision voltage in order for the calibration to be accurate. In an exemplary embodiment, CALDAC 148 is realized by using two 12-bit sigma-delta (SD) DACS to create a high precision differential signal. FIG. 6 shows a block diagram of a differential 12b calibration DAC using a pair of 1b 2nd order SD encoders 170, followed each by a 2-level (1b) voltage-mode DAC with a 3d-order passive RC low-pass filter 172. The upper DAC level is nominally 1V supply (AVDD), the lower one is VREF that tracks AVDD with a fixed voltage offset (~0.5V), using a resistor RRFEF, a switchable current source (internal or external), and a opamp-based voltage follower 174. To ensure stability of encoders 170, the DAC operational range is kept within 5% to 95% of the total VREF-to-AVDD range.

Figure 7:
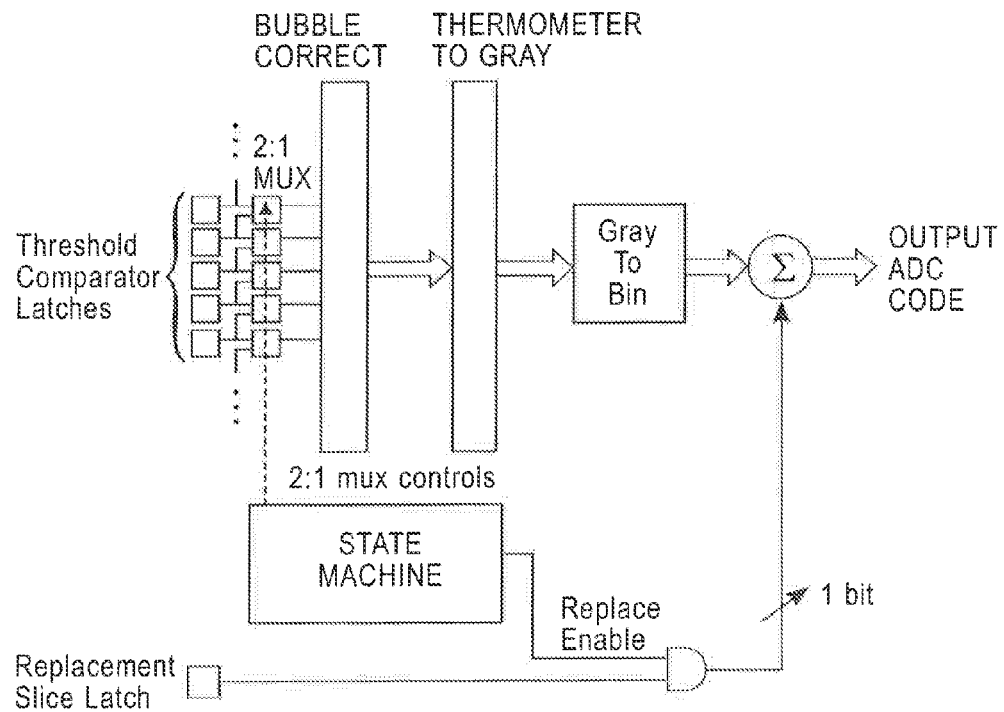
FIG. 7 depicts an error compensator in accordance with an exemplary embodiment of the present disclosure.

Decode logic block 142 shown in FIG. 3 performs the function of combining the outputs of the threshold comparators to produce a digital output code. During normal (no slice being calibrated) operation, this process is achieved using techniques well established in the art, i.e., the outputs of the threshold comparators are passed through bubble correction logic, then thermometer-to-gray-code conversion, and finally gray code to binary code conversion to produce the digital sample value. To support threshold comparator offset calibration, the conventional flash ADC decoder system needs to be modified so the decoder can effectively "ignore" the outputs of the threshold being calibrated and replace its output with the replacement threshold comparator. This is accomplished by switching the binary output of the threshold being calibrated out of the thermometer code using a cascade of 2:1 muxes connected to the threshold comparator binary outputs as shown in FIG. 6. As an illustrative example, if it was desired to switch a threshold comparator latch out of the ADC thermometer code, the 2:1 mux it drives and all below it would select their bottom inputs instead of top (normal) inputs. When a given slice is switched out, the ADC will still produce a valid thermometer code as a function of analog input value, but the final result can be off by one since the calibration threshold level has been intentionally switched out of the thermometer code. This error is compensated using an adder which sums the value of the replacement slice to the binary code at the output of the decoder when enabled by the calibration state machine as shown in FIG. 7. The system therefore enables calibration of any arbitrary threshold comparator without degrading the accuracy of the ADC, enabling the ADC to maintain accurate thresholds over process, voltage, and temperature (PVT) variations.

The block diagrams in the figures illustrate the architecture, functionality, and operation of possible implementations of systems, methods and computer program products according to various embodiments. In this regard, each block in the block diagrams may represent a module, segment, or portion of code, which comprises one or more executable instructions for implementing the specified logical function(s). It should also be noted that, in some alternative implementations by those skilled in the art, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams, and combinations of blocks in the block diagrams, can be implemented by special purpose hardware-based systems that perform the specified functions or acts, or combinations of special purpose hardware and computer instructions.

Advantages of the exemplary embodiments of the present disclosure over known methods in the art include:

1) Provides very high precision threshold adjustments (sub mV) for a FLASH ADC at low silicon die area and power overhead.

2) Provides capability to automatically compensate threshold comparator offsets over process/voltage/temperature drift with very low system overhead, i.e. only one replacement threshold comparator slice is needed.

3) Easily supports precise dynamic alignment of per-ADC offsets and gains in an interleaved FLASH ADC realization, thereby supporting very high sample rate (32 Gbs/s) conversion designs.

4) Eliminates the need for a high precision resistive ladder to provide threshold reference voltages, in the described design the needed resistive ladder accuracy can be reduced since the calibration system will automatically remove offset errors arising from inaccurate resistive ladder reference voltages.

Although illustrative embodiments of the present disclosure have been described herein with reference to the accompanying drawings, it is to be understood that the present disclosure is not limited to those precise embodiments, and that various other changes and modifications may be made therein by those skilled in the art without departing from the scope of the claims next presented.

The invention claimed is:

1. An analog-to-digital converter comprising:
a plurality of integrating threshold comparators for forming analog-to-thermometer code conversions;
a thermometer code to binary code logic decoder configured to receive and combine outputs of each of the integrating threshold comparators and output digital samples, and
a coarse resistance ladder comprising a first resistance ladder of the coarse resistance ladder configured to provide a positive reference voltage to each of the integrating threshold comparators and a second resistance configured to provide a negative reference voltage to each of the integrating threshold comparators,
wherein capacitive digital-to-analog conversion offset adjustment of the integrating threshold comparators is controlled by a calibration state machine, and
wherein each integrating threshold comparator is configured to receive a pair of differential input data signals and a pair of differential input reference signals.

2. The analog-to-digital converter of claim 1, wherein the coarse resistive ladder is configured to establish a baseline comparator threshold for each of the integrating threshold comparators.

3. The analog-to-digital converter of claim 2, wherein when in slave hold mode, the integrating threshold comparators determine a difference signal between a coarse reference voltage provided by the coarse resistance ladder and a signal at its input port, the difference signal driving latches that determine if the data signal is above or below a reference threshold.

4. The analog-to-digital converter of claim 1, wherein each integrating threshold comparator comprises:
a differential comparator that inputs differential data input from a respective slave sampler multiplexer and differential reference inputs from the coarse resistive ladder; and
adjustable capacitance-digital-to-analog-converters in parallel with outputs of respective integrating threshold comparators and configured to compensate for undesired voltage offsets inherent in the coarse resistance ladder in response to control signals from the calibration state machine.

5. The analog-to-digital converter of claim 4, wherein the adjustable capacitance digital-to-analog converters are configured to provide a segmented, overlapped offset voltage characteristic to ensure coverage of all offsets over a prescribed range.

6. The analog-to-digital converter of claim 4, wherein, the calibration digital-to-analog converter is driven by the logic state machine to determine appropriate values to store to the adjustable capacitance-digital-to-analog converters to cancel integrating threshold comparator offsets.

* * * * *